United States Patent [19]
Fujimoto et al.

[11] Patent Number: 5,693,963
[45] Date of Patent: Dec. 2, 1997

[54] COMPOUND SEMICONDUCTOR DEVICE WITH NITRIDE

[75] Inventors: Hidetoshi Fujimoto, Kawasaki; Koichi Nitta; Masayuki Ishikawa, both of Yokohama; Hideto Sugawara, Kawasaki; Yoshihiro Kokubun, Yokohama; Masahiro Yamamoto, Sagamihara, all of Japan

[73] Assignee: Kabushiki Kaisha Toshiba, Kawasaki, Japan

[21] Appl. No.: 526,700

[22] Filed: Sep. 11, 1995

[30] Foreign Application Priority Data

Sep. 19, 1994 [JP] Japan ..................... 6-222773

[51] Int. Cl.⁶ .................................. H01L 33/00
[52] U.S. Cl. ................. 257/94; 257/96; 257/97; 257/102; 257/103
[58] Field of Search .................. 257/102, 103, 257/94, 95, 96, 97

[56] References Cited

U.S. PATENT DOCUMENTS 5,278,433  1/1994  Manabe et al. ............... 257/102 X
5,281,830  1/1994  Kotaki et al. ................. 257/94 X

FOREIGN PATENT DOCUMENTS 6177423  6/1774  Japan ....................... 257/96
4321280  11/1992  Japan ....................... 257/102
5-55631  3/1993  Japan .
6177434  6/1994  Japan ....................... 257/102

*Primary Examiner*—William Mintel
*Attorney, Agent, or Firm*—Oblon, Spivak, McClelland, Maier & Neustadt, P.C.

[57] ABSTRACT

A light emitting diode is arranged on a sapphire substrate. The light emitting diode includes an n-GaN layer, an n-InGaN light-emitting layer, a p-AlGaN layer and a P-GaN layer, which are grown through vapor phase growth in this sequence. Within the p-GaN layer and p-AlGaN layer, $1\times10^{20}$ cm$^{-3}$ of Mg and $2\times10^{19}$ cm$^{-3}$ of Mg are contained, respectively. Within each of the n-GaN layer and n-InGaN light-emitting layer, $5\times10^{18}$ cm$^{-3}$ of hydrogen is contained, thereby preventing Mg from diffusing therein from the p-GaN layer and p-AlGaN layer.

20 Claims, 3 Drawing Sheets

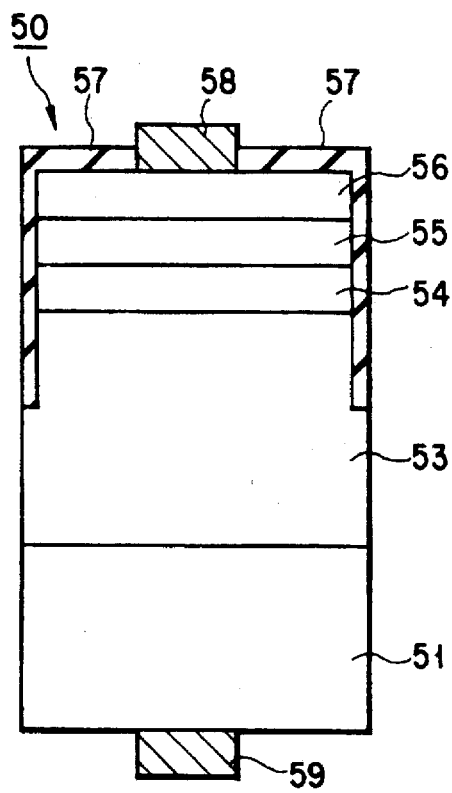
F I G. 5
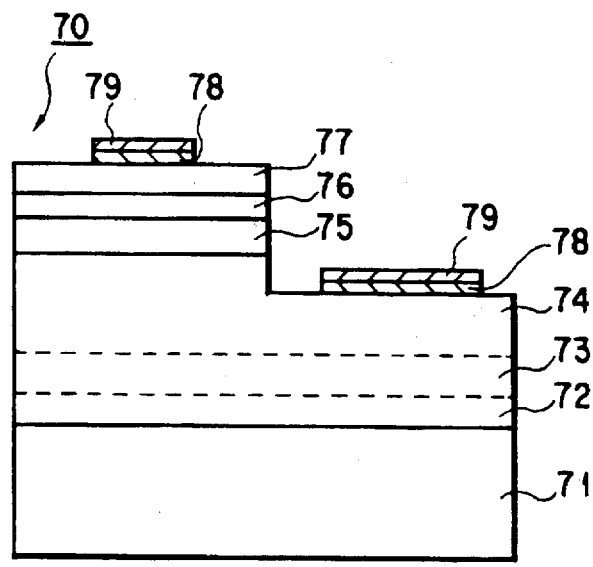
F I G. 7
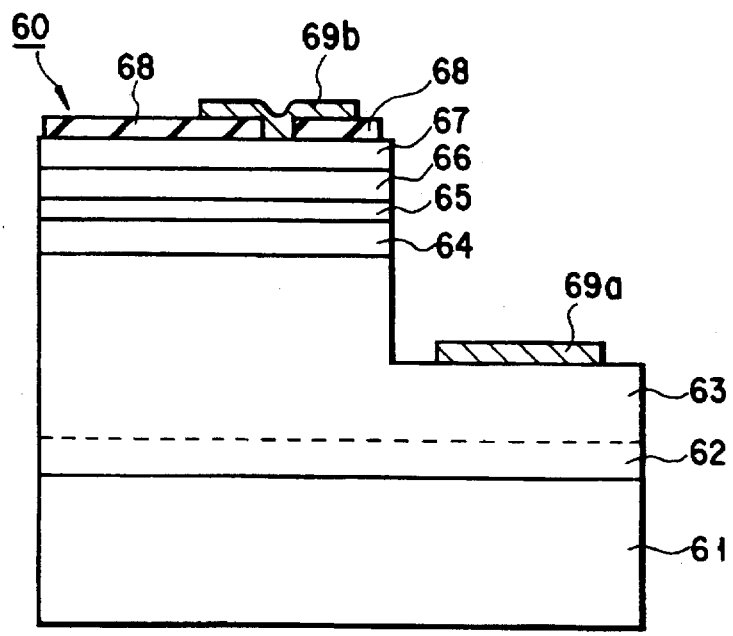
F I G. 6

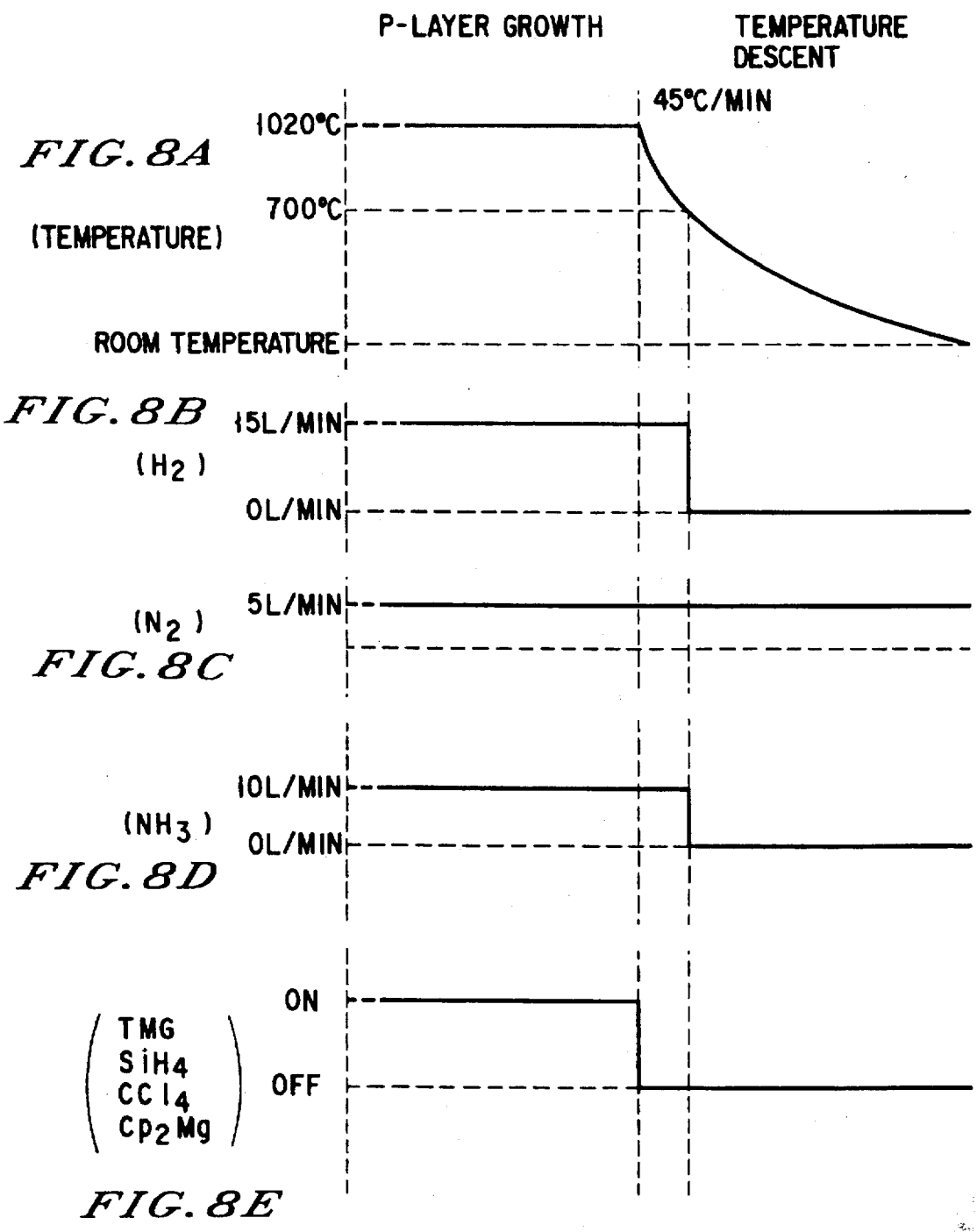

COMPOUND SEMICONDUCTOR DEVICE WITH NITRIDE

BACKGROUND OF THE INVENTION

1. Field of the Invention

The present invention relates to a compound semiconductor device composed of nitride compound semiconductors formed on a substrate, and more particularly to a light emitting device composed of compound semiconductors.

2. Description of the Related Art

Recently, a nitride compound semiconductor, expressed by the general formula of BAlGaInN, has been known as a material for blue or purple light emitting diodes. The well-known diode using such a material has an MIS (Metal-Insulator-Semiconductor) structure. However, the diode of such an MIS type has disadvantages that its operating voltage is high, its luminous strength is weak and further its element life is short. As one of means to overcome these disadvantages, there has already been known to shift to a pn-junction type.

The above materials are grown on a sapphire substrate principally through a metalorganic chemical vapor deposition method (hereinafter referred to as an MOCVD method) or molecular beam epitaxy method (an MBE method). Even if these methods are not used, the nitride compound semiconductor has a variety of problems.

The first problem concerning the nitride compound semiconductor takes place during its crystal growth. Generally, in the crystal growth process utilizing a non-equilibrium state, such as by an MOCVD or MBE method, the growth pursues the following process, i.e., firstly crystal nucleuses for growing are formed; secondly the entire nucleuses grow (the threedimensional growth); then the nucleuses associate together to become a flat film; and finally the film grows in a growth-axis direction (the two-dimensional growth). As the result of crystal growth experiments using a sapphire substrate by the inventors, a problem has been found that, in case of n-type crystal growth by adding Si, a shift period of time from the three-dimensional growth to the two-dimensional growth is longer than that of a so-called undoped film or a p-type film intentionally doped with Mg, and it is especially difficult to obtain a flat film where the film has a thickness of 1 μm or less.

The second problem concerning the nitride compound semiconductor is of crystal quality. Generally, it is well known that, in the nitride compound semiconductor, nitrogen vacancies tend to be produced inside the crystal, because of very high vapor pressure of $N_2$. Each nitrogen vacancy forms a deep donor level of energy. Therefore, particularly as to a light-emitting element, light generated at a light-emitting layer is absorbed due to transition of low energy concerned with the deep donor level, and light take-out efficiency is reduced. As the means to fill such nitrogen vacancies, it is known to use an element of group V, such as P or As, except N, as described in Jap. Pat. Appln. KOKAI Publication No. 49-29770. However, GaP (gallium phosphide) or GaAs (gallium arsenide) is extremely lower in energy gap than GaN. Therefore, when such impurities, for instance P or As, are added to GaN, energy gaps of these mixed crystal semiconductor GaPN or GaAsN become extremely decreased, and there is a problem that a light emission of short wave length, utilizing a large energy gap belonging to characteristics of the nitride compound semiconductor, cannot be obtained.

The third problem concerning the nitride compound semiconductor is also of crystal quality. When a nitride compound semiconductor film is formed on a semiconductor substrate, such as Si or GaAs, used generally for formation of semiconductor elements, the nitride compound semiconductor film formed on the substrate takes over the crystal system, a cubic system, of the substrate, and thereby the epitaxial layer becomes a film of a cubic system and not of a hexagonal system. Therefore, conventionally, a sapphire substrate is used, so as to form a nitride compound semiconductor film having a hexagonal system. However, where the sapphire substrate which has no conductivity is used, it is necessary to etch some layers from the surface so as to attain an electrical contact with a layer which is not exposed to the surface, in the case of a semiconductor element, especially a light-emitting element, having a layered structure of nitride compound semiconductor films. As a result of experiments conducted by the inventors, a problem has been found that a p-type nitride compound having added Mg is very difficult to be eliminated by etching treatments.

The fourth problem concerning the nitride compound semiconductor is of impurity diffusion during element formation following the crystal growth. Besides the nitride compound semiconductor belonging to the subject according to the present invention, during manufacturing process of semiconductor elements, heat treatments following crystal growth are generally performed in order to obtain various states. During this treatment, impurities which are expected to be kept at desired positions are diffused, and there becomes a problem that it results in harmful effects on several characteristics of elements. From experimental results by the inventors, it has been found that Mg diffusion is most remarkable among the impurities generally utilized.

As mentioned above, the nitride compound semiconductor film has, from a view point of characteristics of crystal itself or crystal growth, a variety of problems, such as difficulty in formation of a flat thin film, presence of nitrogen vacancies, difficulty in crystal etching and impurity diffusion during heat treatment. These problems have become severe in case of forming a semiconductor element, especially a light-emitting element, of nitride compound semiconductor films, particularly using sapphire as a substrate.

SUMMARY OF THE INVENTION

The present invention has been made in consideration of the above problems, and it is an object of the present invention to solve these problems by means of impurity addition during formation of the nitride compound semiconductor layers.

According to a first aspect of the present invention, there is provided a compound semiconductor device comprising:

a crystal substrate; and a first semiconductor film composed of n-type or i-type (intrinsic or neutral conductivity type) nitride compound, supported by the substrate through vapor phase growth, wherein the first semiconductor film contains $1 \times 10^{15}$ cm$^{-3}$ to $1 \times 10^{17}$ cm$^{-3}$ of magnesium or $1 \times 10^{15}$ cm$^{-3}$ to $1 \times 10^{17}$ cm$^{-3}$ of zinc so as to accelerate a shift from its three-dimensional growth to its two-dimensional growth.

According to a second aspect of the present invention, there is provided a compound semiconductor device comprising:

a crystal substrate; and a first semiconductor film composed of nitride compound, supported by the substrate through vapor phase growth, wherein the first semiconductor film contains $1 \times 10^{16}$ cm$^{-3}$ to $5 \times 10^{17}$ cm$^{-3}$ of carbon, $1 \times 10^{18}$ cm$^{-3}$ to $1 \times 10^{20}$ cm$^{-3}$ of oxygen, $1\times10^{16}$ cm$^{-3}$ to $1\times10^{18}$ cm$^{-3}$ of selenium, or $1\times10^{16}$ cm$^{-3}$ to $1\times10^{18}$ cm$^{-3}$ of sulfur so as to fill nitrogen vacancies thereof.

According to a third aspect of the present invention, there is provided a compound semiconductor device comprising:

a crystal substrate; and a second semiconductor film composed of p- or i-type nitride compound, formed to be supported by the substrate through vapor phase growth and containing magnesium, wherein the second semiconductor film contains $1\times10^{16}$ cm$^{-3}$ to $8\times10^{17}$ cm$^{-3}$ of silicon so as to facilitate etching thereof.

According to a fourth aspect of the present invention, there is provided a compound semiconductor device comprising:

a crystal substrate; and first and second semiconductor films supported by the substrate and mutually laminated, the first semiconductor film being composed of n- or i-type nitride compound, formed through vapor phase growth, the second semiconductor film being composed of p- or i-type nitride compound containing magnesium, wherein the first semiconductor film contains $3\times10^{18}$ cm$^{-3}$ to $1\times10^{20}$ cm$^{-3}$ of hydrogen so as to prevent magnesium from diffusing thereinto from the second semiconductor film.

Problems to be solved are dependent upon elements. Therefore, functions of the elements to the problems will be described respectively. These elements are divided into four groups, i.e., magnesium (Mg) and zinc (Zn); carbon (C), oxygen (O), selenium (Se) and sulfur (S); silicon (Si); and hydrogen (H).

Initially, the group of Mg and Zn will be described. These elements are related to the first problem, mentioned above, of crystal flatness during its growth. From experimental results by the inventors, as already mentioned above, a crystal film of n-type nitride compound semiconductor having Si added thereto, has been found to be slow in its shift from the three-dimensional growth to the two-dimensional growth. On the contrary, when Mg is also added, its shift from the three-dimensional growth to the two-dimensional growth occurs at an earlier time, i.e., during thin film state, in comparison to when no Mg is added. That is to say, a flat thin film may be formed by adding Mg. However, since Mg is essentially an acceptor impurity, its addition in a large amount will avoid formation of an n-type crystal. Therefore, from experimental results by the inventors, it has been found that an Mg concentration range, which is effective in formation of the n-type crystal without disturbing the formation by Mg addition, is from $1\times10^{15}$ cm$^{-3}$ to $1\times10^{17}$ cm$^{-3}$. A similar effect with Zn also is obtained, and the effective concentration of Zn has been found to fall in a range of from $1\times10^{15}$ cm$^{-3}$ to $1\times10^{17}$ cm$^{-3}$.

Next, the group of C, O, Se and S will be described. These elements are related to the second problem of nitrogen vacancies in crystal. Since atoms of these elements tend to enter the nitrogen site of the nitride compound semiconductor, the nitrogen vacancies peculiar to this compound semiconductor may be filled. Therefore, a deep donor level caused by the nitrogen vacancies may be eliminated. Also, since the above four kinds of impurity elements are impurities which form shallow donors or acceptors by themselves, formation of deep impurity level does not occur by their additions, therefore, loss of light take-out efficiency also does not occur. On the other hand, excess addition of these impurities is not desirable, since reduction in crystalline property causes decrease in light-emitting efficiency. And, as the result of searching for a proper range of impurity concentration, it has been found that C falls in a range of from $1\times10^{16}$ cm$^{-3}$ to $5\times10^{17}$ cm$^{-3}$, O falls in a range of from $1\times10^{18}$ cm$^{-3}$ to $1\times10^{20}$ cm$^{-3}$, Se falls in a range of from $1\times10^{16}$ cm$^{-3}$ to $1\times10^{18}$ cm$^{-3}$ and S falls in a range of from $1\times10^{16}$ cm$^{-3}$ to $1\times10^{18}$ cm$^{-3}$.

Thirdly, Si will be described. This element is related to the third problem, mentioned above, of difficulty of crystal etching. From experimental results by the inventors, it has been found that a general crystal layer of p-type nitride compound semiconductor having Mg added thereto is very difficult to eliminate by etching. However, it has been found that an additional small amount of Si make the etching easy. Further, since Si is essentially a donor impurity of the n-type, its excess addition avoids formation of the p-type crystal. Therefore, from experimental results by the inventors, it has been found that an Si concentration range, which is effective in formation of the n-type crystal without disturbing the formation by Si addition, is from $1\times10^{16}$ cm$^{-3}$ to $8\times10^{17}$ cm$^{-3}$.

Finally, H will be described. A pn-junction structure formed on a substrate and composed of an n-type GaN layer and a p-type GaN layer having Mg added thereto will be considered. When the n-type layer contains no H and further the structure is heat-treated, Mg diffuses from the p-type layer to the n-type layer. Such heat diffusion is remarkably found by Mg among the impurities generally used. This heat diffusion causes the carrier concentration in essentially n-type crystal to be decreased significantly, thereby bringing about a phenomena in which the n-type layer does not serve as n-type. However, when a proper amount of H is present within the n-type layer, Mg diffusion is restricted, and diffusion from the p-type layer to the n-type layer hardly occurs. Thus, it is considered that H has effects to restrict impurity diffusion. From experimental results by the inventors, it has been found that an H concentration capable of restricting diffusion falls in a range of from $1\times10^{18}$ cm$^{-3}$ to $1\times10^{20}$ cm$^{-3}$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a sectional view showing a light-emitting element according to the fifth embodiment of the present invention;

FIG. 6 is a sectional view showing a semiconductor laser element according to the sixth embodiment of the present invention;

FIG. 7 is a sectional view showing a light-emitting element according to the seventh embodiment of the present invention; and FIG. 8 is a timing chart showing an operation when the temperature is decreased in a process of manufacturing the light-emitting element according to the first embodiment.

DETAILED DESCRIPTION OF THE PREFERRED EMBODIMENTS

Embodiments of the present invention will be described with reference to the drawings.

[First Embodiment]

Figure 1:
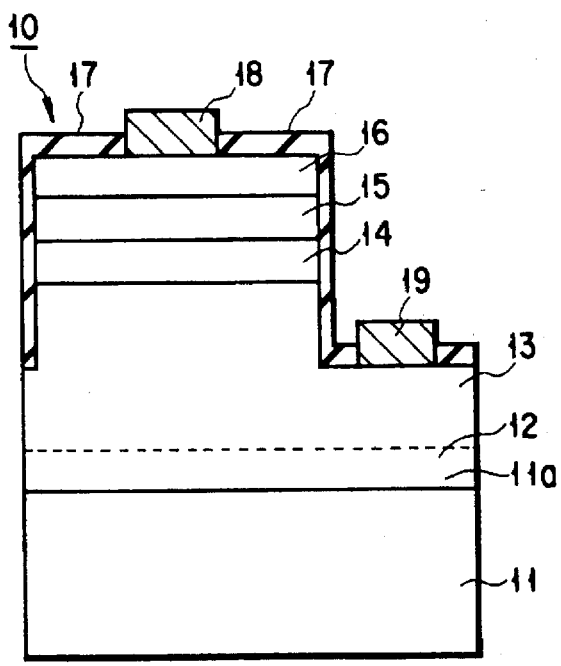
FIG. 1 is a sectional view showing a light-emitting element according to the first embodiment of the present invention.

FIG. 1 is a sectional view showing a light-emitting diode 10 according to the first embodiment of the present invention.

The light emitting diode 10 has a sapphire substrate 11, on the main face 11a of which a buffer layer 12 of 50 nm thickness is formed in order to relax lattice mismatching. Further, on the buffer layer 12 are laminated, in sequence, an n-GaN layer 13 of 4 μm thickness, an n-InGaN light-emitting layer 14 of 50 μm thickness, a p-AlGaN layer 15 of 150 nm thickness as a clad layer and a p-GaN layer 16 of 300 nm thickness. The n-GaN layer 13 serves also as a clad layer.

Within each layer from the n-GaN layer 13 to the p-GaN layer 16, $2 \times 10^{17}$ cm$^{-3}$ of carbon is present. Also, as will be described in the second embodiment, a small amount of Si is present in the p-AlGaN layer 15 and the p-GaN layer 16 for making etching easier.

After crystal growth, the p-GaN layer 16 to the n-InGaN layer 14 are etched until the n-GaN layer 13 is exposed, and then almost the entire face is covered with a SiO$_2$ film 17 of 400 nm thickness. At the required portion on the SiO$_2$ film 17 are formed some holes, and an Au-Ni film 18 to the p-layer 16 and an Al film 19 to the n-layer 13 are formed to dispose ohmic electrodes.

Hereinafter, an example of manufacturing processes of the light emitting diode 10 will be described in sequence.

The light emitting diode 10 was prepared by vapor phase growth through a metalorganic chemical vapor deposition method (an MOCVD method). Ammonia (NH$_3$), silane (SiH$_4$) and carbon tetrachloride (CCl$_4$) as raw material gases as well as H$_2$ and N$_2$ as carrier gases were used. And, trimethylgallium ((CH$_3$)$_3$Ga) (hereinafter referred to as TMG), trimethylaluminum ((CH$_3$)$_3$Al) (hereinafter referred to as TMA), trimethylindium ((CH$_3$)$_3$In) (hereinafter referred to as TMI), dimethylzinc ((CH$_3$)$_2$Zn) (hereinafter referred to as DMZ) and biscyclopentadienyl magnesium ((C$_5$H$_5$)$_2$Mg) (hereinafter referred to as CP$_2$Mg) were used as organometal raw materials.

Initially, the single crystal sapphire substrate 11, the main face 11a of which is of c-face cleaned by organic-solvent cleaning, acid cleaning and heat treatment, was mounted on a heatable susceptor placed in the reaction room of an MOCVD unit. Then, the main face 11a of the sapphire substrate 11 was vapor-phase etched for about 10 minutes under the normal pressure at 1050° C. during a H2 flow rate of 10 L/min.

Next, the temperature of the sapphire substrate 11 was lowered to 510° C., and then the buffer layer 12 was formed by flowing H$_2$ at a flow rate of 15 L/min, N$_2$ at 5 L/min, NH$_3$ at 10 L/min and TMG at 25 cc/min, respectively, for 6 minutes.

The temperature of the sapphire substrate 11 was then increased to 1020° C. and maintained at this temperature, and then the n-GaN layer 13 was formed by flowing H$_2$ at a flow rate of 15 L/min, N$_2$ at 5 L/min, NH$_3$ at 10 L/min, TMG at 25 cc/min, SiH$_4$ of 100 ppm at 1 cc/min and CCl$_4$ at 5 cc/min, respectively, for 60 minutes.

The temperature of the sapphire substrate 11 was then lowered to 800° C., and then the n-InGaN layer 14 was formed by flowing H$_2$ at a flow rate of 5 L/min, N$_2$ at 15 L/min, NH$_3$ at 10 L/min, TMG at 3 cc/min, TMI at 100 cc/min, SiH$_4$ at 1 cc/min, DMZ at 10 cc/min and CCl$_4$ at 5 cc/min, respectively, for 15 minutes.

The temperature of the sapphire substrate 11 was then increased until 1020° C. and maintained at this temperature, the p-AlGaN layer 15 was formed by flowing H$_2$ at a flow rate of 15 L/min, N$_2$ at 5 L/min, NH$_3$ at 10 L/min, TMG at 50 cc/min, TMA at 25 cc/min, CP$_2$Mg at 30 cc/min, CCl$_4$ at 25 cc/min and SiH$_4$ at 0.1 cc/min, respectively, for 5 minutes.

Further, while the temperature of the sapphire substrate 11 was maintained at 1020° C., the p-GaN layer 16 was formed by flowing H$_2$ at a flow rate of 15 L/min, N$_2$ at 5 L/min, NH$_2$ at 10 L/min, TMG at 25 cc/min, CP$_2$Mg at 30 cc/min, CCl$_4$ at 5 cc/min and SiH$_4$ at 0.1 cc/min, respectively, for 5 minutes. By using CCl$_4$ as a growth gas in this way, each growth layer should contain C.

Thereafter, TMG, CP$_2$Mg and CCl$_4$ flows were stopped, and during flowing H$_2$, N$_2$ and NH$_3$ at a flow rate of 15, 5 and 10 L/min, respectively, the sapphire substrate 11 was lowered in temperature to 700° C. Further, the flow of H$_2$ and NH$_3$ was stopped, and, during flowing of N$_2$ at a flow rate of 5 L/min, the sapphire substrate 11 was left on a susceptor to lower its temperature to room temperature (see FIG. 8).

In the method described above, the temperature at which H$_2$ and NH$_3$ are stopped while only N$_2$ is allowed to flow should be 300° C. or more, and preferably 500° C. or more. This is because, under a hydrogen atmosphere at a high temperature, impurities present near the surface of a growing crystal film may be made inactive by active hydrogen. Under such a hydrogen atmosphere at a high temperature, the ratio of activated impurities is as low as about 1%. In this case, non-activated impurities form lattice defects to function as non-radiative recombination centers, thereby greatly lowing the efficiency of the element. In contrast, it has been found that, where switching of the gases is carried out at a high temperature, at least 7% of, and generally 10% or more of the added impurities are activated.

The substrate is desirably cooled at a rate of 50° C./min or less. Where the substrate is cooled faster than this rate, cracks may occur in the surface of crystal due to thermal stress of the crystal, especially when using a mixed crystal having added Al, such as AlGaN.

As a gas used during the lowering of the temperature, N$_2$, which is one of the components of the matrix crystal, is preferably used, but another inactive gas, such as He or Ar can be used.

By performing the above-described steps, it becomes unnecessary to carry out, e.g., a thermal annealing step conventionally adopted for improving the activated ratio of impurities, so that the process is simplified and the period of time needed for the process is shortened. Further, it is possible to attain an activated ratio higher than that obtained by a post step, such as a thermal annealing step.

The sapphire substrate 11, on which the nitride compound semiconductor layers grew, was then removed from the MOCVD unit, and then, was etched by an alkaline aqueous solution until the n-GaN layer was exposed, while a resist or the like was used as a mask, in order to make a mesa structure. Then, on the surface was formed a $SiO_2$ film 17 of about 400 nm thickness in a CVD unit. With this film, leak current at the portion adjacent to the pn-junction interface exposed at the mesa structure side was lowered, and thereby degradation of the element was lowered.

In the $SiO_2$ film 17 two holes of about 100 μm square and 100 μm diameter, respectively, were then formed so that the p-GaN layer 16 and n-GaN layer 13 were exposed respectively, by using a hydrofluoric acid solution. Through these holes, an Au-Ni film 18 of about 1 μm thickness to the p-GaN layer 16 and an Al film 19 of about 600 nm thickness to the n-GaN layer 13 were formed respectively, in order to make ohmic electrodes. By means of the above process the light-emitting diode was prepared.

Impurity concentrations within each layer of the light emitting diode 10 are as follows. Only Mg concentration within the p-GaN layer 16 is $1\times10^{20}$ $cm^{-3}$, and concentrations of Si, Zn and Mg within the n-GaN layer 13, n-InGaN layer 14 and p-AlGaN layer 15 were $2\times10^{19}$ $cm^{-3}$, respectively. Also, a C concentration within the layers from the n-GaN layer 13 to the p-GaN layer 16 was $2\times10^{17}$ $cm^{-3}$, respectively.

The light-emitting diode 10 formed in this manner was die-cut into a size of about 350 μm square, was mounted on a stem and then was molded to form a lamp. By this diode, a light output of about 2–3 mW was obtained with respect to a forward current of 20 mA, and its life of about 20,000 hours was established. These values are improved by about 2 to 3 times in comparison with characteristics of a light-emitting diode which contains substantially no C or a C concentration of identification limit or less but has a similar structure.

At a carbon concentration which falls in a range of from $1\times10^{16}$ $cm^{-3}$ to $5\times10^{17}$ $cm^{-3}$, similar effects as mentioned above were obtained. At values lower than this range, the take-out efficiency was decreased because of formation of a deep level of nitrogen vacancies. That is to say, effects by C addition were not found. On the other hand, at values higher than this range, carbon was precipitated within the crystal, which became a non-radiative recombination center or crystal defect, and effects were hardly noticed. In order to obtain significant effects, a C concentration is preferred to fall in the range of from $5\times10^{16}$ $cm^{-3}$ to $5\times10^{17}$ $cm^{-3}$, and further at a C concentration of from $1\times10^{17}$ $cm^{-3}$ to $3\times10^{17}$ $cm^{-3}$, the take-out efficiency gave a maximum value.

Hitherto, a InGaN light-emitting layer has been described. Similar effects also were obtained with a GaN or InGaAlN light-emitting layer.

[Second Embodiment]

Figure 2:
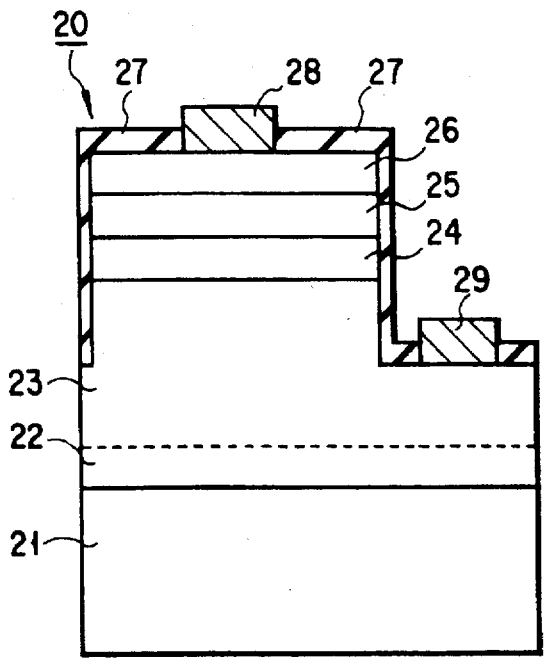
FIG. 2 is a sectional view showing a light-emitting element according to the second embodiment of the present invention.

FIG. 2 is a sectional view showing a light-emitting diode 20 according to the second embodiment of the present invention.

The light-emitting diode 20 has a sapphire substrate 21, whereon a buffer layer 22 of 50 nm thickness is formed, in order to relax lattice mismatching. And on the buffer layer 22 are laminated, in sequence, a n-GaN layer 23 of 3 μm thickness, a n-InGaN light-emitting layer 24 of 100 nm thickness, a p-AlGaN layer 25 of 300 nm thickness as a clad layer and a p-GaN layer 26 of 500 nm thickness.

Impurity concentrations within each layer are as follows. Within the p-GaN layer 26, the Mg concentration is $1\times10^{20}$ $cm^{-3}$ and the Si concentration is $1\times10^{17}$ $cm^{-3}$. Within the p-AlGaN layer 25, the Mg concentration is $2\times10^{19}$ $cm^{-3}$ and the Si concentration is $1\times10^{17}$ $cm^{-3}$. Within the n-InGaN layer 24, the Si concentration is $2\times10^{19}$ $cm^{-3}$ and the Zn concentration is $1\times10^{18}$ $cm^{-3}$. Within the n-GaN layer 23, the Si concentration is $2\times10^{19}$ $cm^{-3}$.

Hereinafter, an example of manufacturing processes of the light emitting diode 20 will be described in sequence.

Initially, the single crystal sapphire substrate 21, the main face of which is of a-face, which is of the (11–20) plane, cleaned by organic-solvent cleaning, acid cleaning and heat treatment, was mounted on a heatable susceptor placed in the reaction section an MOCVD unit. Then, the main face of the sapphire substrate 21 was vapor-phase etched for about 10 minutes under normal pressure at 1050° C. during a $H_2$ flow rate of 10 L/min.

Next, the temperature of the sapphire substrate 21 was lowered to 510° C., and then the buffer layer 22 was formed by flowing $H_2$ at a flow rate of 15 L/min, $N_2$ at 10 L/min, $NH_3$ at 5 L/min and TMG at 25 cc/min, respectively.

The temperature of the sapphire substrate 21 was then increased to 1020° C. and maintained at this temperature, and then the n-GaN layer 23 was formed by flowing $H_2$ at a flow rate of 15 L/min, $N_2$ at 10 L/min, $NH_3$ at 5 L/min, TMG at 25 cc/min and $SiH_4$ at 5 cc/min, respectively, for 60 minutes.

The temperature of sapphire substrate 21 was then decreased to 800° C., and then an n-InGaN layer 24 was formed by flowing $H_2$ at a flow rate of 10 L/min, $N_2$ at 15 L/min, $NH_3$ at 5 L/min, triethylgallium $((C_2H_5)_3Ga)$ (hereinafter referred to TEG) at 3 cc/min, TMI at 30 cc/min, DMZ at 1 cc/min and $SiH_4$ at 1 cc/min, respectively, for 30 minutes. Such Zn addition during layer formation serves not only to give radiative centers, but to aid growth of a flat thin film.

Next, after the temperature of the sapphire substrate 21 was increased to 1020° C. and maintained at this temperature, the p-AlGaN layer 25 was formed by flowing $H_2$ at a flow rate of 15 L/min, $N_2$ at 10 L/min, $NH_3$ at 5 L/min, TMG at 50 cc/min, TMA at 25 cc/min, $CP_2Mg$ at 50 cc/min and $SiH_4$ at 1 cc/min, respectively, for 10 minutes.

Further, while the temperature of the sapphire substrate 21 was maintained at 1020° C., the p-GaN layer 26 was formed by flowing $H_2$ at a flow rate of 15 L/min, $N_2$ at 10 L/min, $NH_3$ at 5 L/min, TMG at 25 cc/min, $CP_2Mg$ at 100 cc/min and $SiH_4$ at 1 cc/min, respectively, for 10 minutes.

Hereinafter, the TMG, $CP_2Mg$ and $SiH_4$ flow was stopped, and during flowing $H_2$, $N_2$ and $NH_3$ at a flow rate of 15, 10 and 5 L/min, respectively, the temperature of the sapphire substrate 21 was lowered until 800° C. Further, during flowing $N_2$ at a flow rate of 10 L/min, the sapphire substrate 21 was left on the susceptor to lower it to room temperature.

The sapphire substrate 21, where a nitride compound semiconductor layer grew, was then removed from the MOCVD unit, and then, was etched by an alkaline aqueous solution until the n-GaN layer was exposed, while a resist or the like was used as a mask, in order to make a mesa structure. Then, on the surface a $SiO_2$ film 27 was formed of about 200 nm thickness in a CVD unit. With the film, the leak current was lowered at the portion adjacent to the pn-junction interface exposed at the mesa structure side, and degradation of the element was also lowered.

Further, on the $SiO_2$ film 27 two holes of about 100 μm square and 120 μm diameter, respectively, were formed by using a hydrofluoric acid solution so that the p-GaN layer 26 and n-GaN layer 23 are exposed respectively. Through these holes, an Au-Ni film 28 of about 2 μm thickness to the p-GaN layer 26 and an Al-Ti film 29 of about μm thickness to the n-GaN layer 23 were formed, in order to make ohmic electrodes.

The light emitting diode 20 formed in this manner was die-cut into a size of about 350 µm square, was mounted on a stem and then was molded to form a lamp. The light-emitting diode 20 showed similar performances as that of the first embodiment, with respect to its light-emitting strength as well as reliability.

A Si concentration in each of the p-GaN layer 26 and p-AlGaN layer 25, which is a characteristic point of the diode 20, was $2\times10^{17}$ cm$^{-3}$ as mentioned above. At this concentration, the p-GaN layer 26 and p-AlGaN layer 25 could be removed by etching, and elements were formed. An Si concentration capable of etching was required of $1\times10^{16}$ cm$^{-3}$ or more. On the other hand, since Si is essentially a donor impurity, its excess addition creates a problem that the GaN layer 26 and AlGaN layer 25, which are to be originally the p-type, results in a shift to the n-type. Therefore, it has been found that, although the upper limit of Si concentration is dependent upon an acceptor concentration of the layer, the shift to the n-type rarely occurred at a Si concentration of $8\times10^{17}$ cm$^{-3}$ or less, since a carrier concentration of the p-type, required to form elements, is $1\times10^{18}$ cm$^{-3}$. Further, the Si concentration was preferred to be $5\times10^{17}$ cm$^{-3}$ or less, and, most preferably, to be from $5\times10^{16}$ cm$^{-3}$ to $5\times10^{17}$ cm$^{-3}$ in terms of element formation.

[Third Embodiment]

Figure 3:
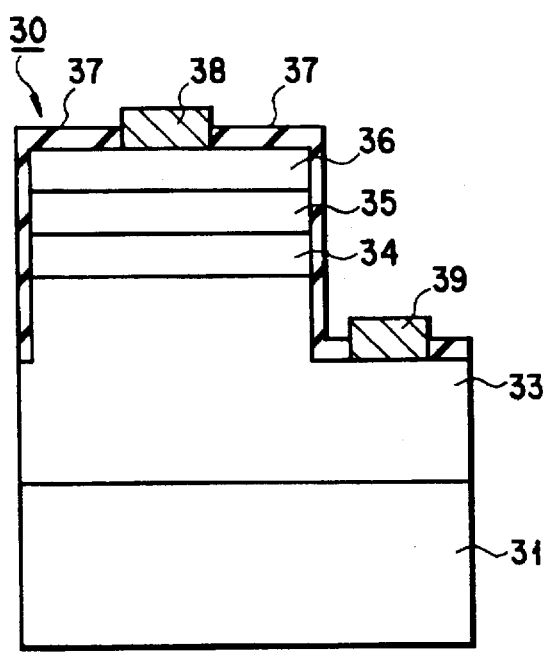
FIG. 3 is a sectional view showing a light-emitting element according to the third embodiment of the present invention.

FIG. 3 is a sectional view showing a light emitting diode 30 according to the third embodiment of the present invention. The light emitting diode 30 has a AlN substrate 31, whereon are laminated, in sequence, a n-AlGaN layer 33 of 4 µm thickness, a n-GaN light-emitting layer 34 of 100 nm thickness, a p-AlGaN layer 35 of 300 nm thickness as a clad layer and a p-GaN layer 36 of 500 nm thickness. And, within each layer from the n-AlGaN layer 33 to the p-GaN layer 36, $1\times10^{18}$ cm$^{-3}$ of oxygen is present.

Hereinafter, an example of manufacturing processes of the light emitting diode 30 will be described in sequence.

Initially, the AlN substrate 31 which was cleaned by organic-solvent cleaning, acid cleaning and heat treatment was mounted on a heatable susceptor placed in the reaction section of an MOCVD unit. Then, the main face of the AlN substrate 21 was vapor-phase etched for about 10 minutes under normal pressure at 1050° C. during a H$_2$ flow rate of 10 L/min.

Next, the temperature of the AlN substrate 31 was lowered to 1000° C. and maintained at this temperature, and then the n-AlGaN layer 33 was formed by flowing H$_2$ at a flow rate of 15 L/min, N$_2$ at 10 L/min, NH$_3$ at 5 L/min, TMA at 25 cc/min, TMG at 50 cc/min, SiH$_4$ at 1 cc/min and oxygen (O$_2$) diluted to 0.1% at 20 cc/min, respectively, for 60 minutes.

While the AlN substrate 31 was kept at a temperature of 1000° C., the n-GaN layer 34 was formed by flowing H$_2$ at a flow rate of 10 L/min, N$_2$ at 15 L/min, NH$_3$ at 5 L/min, TEG at 3 cc/min, DMZ at 10 cc/min, SiH$_4$ at 1 cc/min and diluted oxygen at 300 cc/min, respectively, for 4 minutes.

After the AlN substrate 31 was maintained at a temperature of 1000° C., the p-AlGaN layer 35 was then formed by flowing H$_2$ at a flow rate of 15 L/min, N$_2$ at 10 L/min, NH$_3$ at 5 L/min, TMG at 50 cc/min, TMA at 25 cc/min, CP$_2$Mg at 100 cc/min and diluted O$_2$ at 200 cc/min, respectively, for 5 minutes. Further, while the AlN substrate 31 was maintained at a temperature of 1000° C., a p-GaN layer 36 was formed by flowing H$_2$ at a flow rate of 15 L/min, N$_2$ at 10 L/min, NH$_3$ at 5 L/min, TMG at 50 cc/min, CP$_2$Mg at 30 cc/min and diluted O$_2$ at 200 cc/min, respectively, for about 20 minutes.

Then, the temperature of the AlN substrate 31 was lowered to 900° C. and was left on a susceptor during flowing N$_2$ and NH$_3$ each at a flow rate of 10 L/min.

The AlN substrate 31, on which the nitride compound semiconductor layers grew, was removed from the MOCVD unit, and then was etched by an alkaline aqueous solution until the n-AlGaN layer 33 was exposed, while a resist or the like was used as a mask, in order to make a mesa structure. Then, on the surface a SiO$_2$ film 37 was formed of about 300 nm thickness in a CVD unit. With the film, the leak current at the portion adjacent to the pn-junction interface exposed at the mesa structure side was lowered, and degradation of the element also was lowered.

In the SiO$_2$ film 37 two holes of about 100 µm square and 100 µm diameter, respectively, were then formed by using a hydrofluoric acid solution so that the p-GaN layer 36 and n-AlGaN layer 33 were exposed respectively. Through these holes, an Au-Ni film 38 of about 2 µm thickness to the p-GaN layer 36 and an Al film 39 of about 1 µm thickness to the n-AlGaN layer 33 were formed, in order to make ohmic electrodes.

The light-emitting diode 30 formed in this manner was die-cut into a size of about 400 µm square, was mounted on a stem and then was molded to form a lamp. The light emitting diode 30 showed similar performances as that of the first embodiment with respect to its light-emitting strength as well as reliability.

Impurity concentrations within each layer of the light emitting diode 30 are as follows. Only Mg concentration within the p-GaN layer 36 was $1\times10^{20}$ cm$^{-3}$, and concentrations of Si, Zn and Mg within the n-AlGaN layer 33 to the p-AlGaN layer 35 were $2\times10^{19}$ cm$^{-3}$ respectively. Also, with reference to the oxygen concentration, which is a characteristic point of this embodiment, the effect of filling nitrogen vacancies was obtained, in a range of from $1\times10^{18}$ cm$^{-3}$ to $1\times10^{20}$ cm$^{-3}$, including $1\times10^{18}$ cm$^{-3}$ mentioned above. At values lower than this range, the effect on light-emitting strength was not found. At values higher than this range, a problem of safety of the unit may be present, because of the possibility of explosion. Above all, characteristics as a light-emitting element was highly improved at an oxygen concentration of from $1\times10^{18}$ cm$^{-3}$ to $1\times10^{19}$ cm$^{-3}$.

[Fourth Embodiment]

Figure 4:
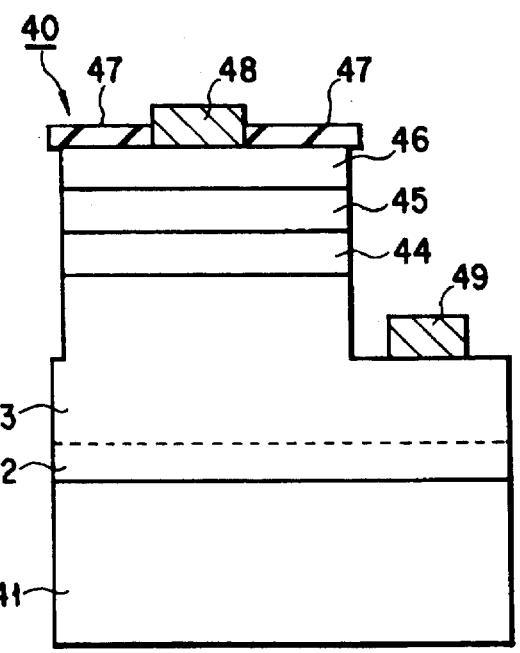
FIG. 4 is a sectional view showing a light-emitting element according to the fourth embodiment of the present invention.

FIG. 4 is a sectional view showing a light emitting diode 40 according to the fourth embodiment of the present invention. The light emitting diode 40 has a sapphire substrate 41, whereon a buffer layer 42 of 50 nm thickness is formed in order to relax lattice mismatching. And, on the buffer layer 42 are laminated, in sequence, a n-GaN layer 43 of 4 µm thickness, a n-InGaN light-emitting layer 44 of 50 nm thickness, a p-AlGaN layer 45 of 150 nm thickness as a clad layer and a p-GaN layer 46 of 300 nm thickness. Within each of the n-GaN layer 43 and n-InGaN lightemitting layer 44, $5\times10^{18}$ cm$^{-3}$ of hydrogen is present.

Further, after crystal growth, layers from the n-InGaN layer 44 to the p-GaN layer 46 are etched until the n-GaN layer 43 is exposed, and then almost the entire surface is covered with an SiO$_2$ film 47 of 400 nm thickness. Holes are formed at the required portions of the SiO$_2$ film 47, and an Au-Ni film 48 to the p-layer 46 and an Al film 49 to the n-layer 43 are formed respectively, in order to dispose ohmic electrodes.

Hereinafter, an example of manufacturing processes of the light emitting diode 40 will be described in sequence.

Initially, a single crystal sapphire substrate 41, the main face of which is of c-face cleaned by organic-solvent cleaning, acid cleaning and heat treatment, was mounted on a heatable susceptor placed in the reaction section of an MOCVD unit. Then, the sapphire substrate 41 was vapor-phase etched for about 10 minutes under the normal pressure at 1100° C. during a H$_2$ flow rate of 20 L/min.

Next, the temperature of the sapphire substrate 41 was lowered to 500° C., and then the buffer layer 42 was formed by flowing $H_2$ at a flow rate of 15 L/min, $N_2$ at 10 L/min, $NH_3$ at 5 L/min, TMG at 25 cc/min and TMA at 40 cc/min, respectively.

The temperature of the sapphire substrate 41 was then increased to 1020° C. and this temperature was maintained, and then the n-GaN layer 43 was formed by flowing $H_2$ at a flow rate of 20 L/min, $N_2$ at 10 L/min, $NH_3$ at 10 L/min, TMG at 25 cc/min and $SiH_4$ at 1 cc/min, respectively, for 60 minutes.

The temperature of the sapphire substrate 41 was then decreased to 800° C., and then the n-InGaN layer 44 was formed by flowing $H_2$ at a flow rate of 20 L/min, $N_2$ at 15 L/min, $NH_3$ at 10 L/min, TEG at 3 cc/min, TMI at 30 cc/min, DMZ at 1 cc/min, and $SiH_4$ at 1 cc/min, respectively, for 15 minutes.

After the temperature of the sapphire substrate 41 was increased to 1020° C. and this temperature maintained, the p-AlGaN layer 45 was formed by flowing $H_2$ at a flow rate of 15 L/min, $N_2$ at 10 L/min, $NH_3$ at 10 L/min, TMG at 50 cc/min, TMA at 25 cc/min, $CP_2Mg$ at 30 cc/min and $SiH_4$ at 0.1 cc/min, respectively, for 5 minutes.

Further, while the sapphire substrate 41 was maintained at a temperature of 1020° C., the p-GaN layer 46 was formed by flowing $H_2$ at a flow rate of 15 L/min, $N_2$ at 10 L/min, $NH_3$ at 10 L/min, TMG at 50 cc/min, $CP_2Mg$ at 100 cc/min and $SiH_4$ at 0.1 cc/min, respectively, for 5 minutes. As to growth of the above p-AlGaN layer 45 and p-GaN layer 46, Si was added for etching easiness, as mentioned in the second embodiment.

Thereafter, the temperature of the sapphire substrate 41 was lowered to 800° C. and was left on the susceptor at normal temperature during a $N_2$ flow rate of 10 L/min.

The sapphire substrate 41, on which the a nitride compound semiconductor layers grew, was removed from the MOCVD unit, and on the surface was formed the $SiO_2$ film 47 of about 400 nm thickness in a CVD unit. While using the $SiO_2$ film 47 as a mask, an etching was carried out by a well-known reactive ion-etching (RIE) method until the n-GaN layer 43 was exposed, in order to make a mesa structure. On the $SiO_2$ film 47, a hole of about 100 µm square was formed by a hydrofluoric acid solution so that the p-GaN layer 46 was exposed. Through the hole, the Au-Ni film 48 of about 1 µm thickness to the p-layer 46 and the Al film 49 of about 600 nm thickness to the n-layer 43 were formed respectively, in order to make ohmic electrodes.

The light emitting diode 40 formed in this manner was die-cut into a size of about 350 pm square and then was prepared to form a lamp. The light emitting diode 40 showed similar light-emitting strength and reliability as those of the diode 10 mentioned above.

Impurity concentrations within each layer of the light emitting diode 40 are as follows. Only Mg concentration within the p-GaN layer 46 was $1 \times 10^{20}$ $cm^{-3}$, and concentrations of Si, Zn and Mg within the n-GaN layer 43 to the p-AlGaN layer 45 were $2 \times 10^{19}$ $cm^{-3}$, respectively. Further, the hydrogen concentration in the n-GaN layer 43 and n-InGaN layer 44, which is a characteristic point of this embodiment, was $5 \times 10^{18}$ $cm^{-3}$. Where the hydrogen concentration was in a range of from $3 \times 10^{18}$ $cm^{-3}$ to $1 \times 10^{20}$ $cm^{-3}$, Mg diffusion from the p-AlGaN layer 45 and p-GaN layer 46 were restricted. At values lower than the range, Mg diffusion to the n-layer 43 and 44 was significant, and also phenomena were found that these layers were either reduced to a insulation layer or shifted to p-type by a compensation effect. On the other hand, at values higher than this range, hydrogen associated with impurities as a factor of carriers and caused carriers to be inactivated. Therefore, a hydrogen concentration was required to fall in a range of from $3 \times 10^{18}$ $cm^{-3}$ to $1 \times 10^{20}$ $cm^{-3}$. And, more preferably, its effect were significant when the concentration was in the range of from $3 \times 10^{18}$ $cm^{-3}$ to $1 \times 10^{19}$ $cm^{-3}$.

[Fifth Embodiment]

FIG. 5 is a sectional view showing a light-emitting diode 50 according to the fifth embodiment of the present invention.

The fifth embodiment greatly differs from the four embodiments mentioned above in that SiC is used as a substrate 51. The principal impurity within each layer of nitride semiconductor is as follows. Nitrogen (N) is present within an SiC substrate 51, Si within a n-GaN layer 53, Si and Zn within a n-InGaN light-emitting layer 54, and Mg within a p-AlGaN layer 55 as a clad layer and a p-GaN layer 56. These concentrations are, as in the four former embodiments, as follows; Zn within the n-InGaN light-emitting layer 54 and Mg within the p-AlGaN layer 55 are $2 \times 10^{19}$ $cm^{-3}$ respectively; and Mg within the p-GaN layer 56 is $1 \times 10^{20}$ $cm^{-3}$. Also, Si is present about at $1 \times 10^{19}$ $cm^{-3}$ within the n-layers 53 and 54, and is present at about $8 \times 10^{16}$ $cm^{-3}$ within the p-layers of 55 and 56. As to the other impurities, within each layer from the n-GaN layer 53 to the p-GaN layer 56 $1 \times 10^{18}$ $cm^{-3}$ of carbon and $1 \times 10^{18}$ $cm^{-3}$ of oxygen are present.

Concerning the preparation process, as in the four embodiments mentioned above, an MOCVD method was utilized. In this embodiment, besides the similar effects as that of the first and second embodiments, crystal defect density was greatly reduced, and performances were improved by two times in its light-emitting strength and by three times in its life, in comparison with the light emitting diode 10.

[Sixth Embodiment]

FIG. 6 is a sectional view showing a laser diode 60 according to the sixth embodiment of the present invention.

The laser diode 60 has a sapphire substrate 61, whereon are laminated, in sequence, a GaN buffer layer 62 of 50 nm thickness, a n-GaN layer 63 of 2 µm thickness, a n-AlGaN layer 64 of 500 nm thickness (an Al composition ratio of 0.3), an undoped GaN layer 65 of 100 nm, a p-AlGaN layer 66 of 500 nm thickness (an Al composition ratio of 0.3) and a p-GaN layer 67 of 300 nm.

Impurity concentrations within each layer are as follows; $2 \times 10^{19}$ $cm^{-3}$ of Si and $5 \times 10^{16}$ $cm^{-3}$ of Mg are present within the n-GaN layer 63; $2 \times 10^{19}$ $cm^{-3}$ of Si and $8 \times 10^{16}$ $cm^{-3}$ of Mg within the n-AlGaN layer 64; $1 \times 10^{17}$ $cm^{-3}$ of Mg within the undoped GaN layer 65; $3 \times 10^{19}$ $cm^{-3}$ of Mg within the p-AlGaN layer 66; and $1 \times 10^{20}$ $cm^{-3}$ of Mg within the p-GaN layer 67.

The process of preparing the element was carried out in the same manner as those of the embodiments mentioned above. Within each layer from the n-GaN layer 63 to the undoped GaN layer 65, Mg in the amount of the above concentration was added to form a flat thin film. Effective Mg concentration was in the range of from $1 \times 10^{15}$ $cm^{-3}$ to $1 \times 10^{17}$ $cm^{-3}$. At values lower than this range, a flat thin film was not obtained. On the other hand, at values higher than this range, the n-layer was reduced in its carrier concentration, and it became difficult to obtain a flat film without additional Si. Therefore, Mg concentration was proper to fall in a range of from $1 \times 10^{15}$ $cm^{-3}$ to $1 \times 10^{17}$ $cm^{-3}$, and preferably of from $1 \times 10^{16}$ $cm^{-3}$ to $1 \times 10^{17}$ $cm^{-3}$.

[Seventh Embodiment]

FIG. 7 is a sectional view showing a light-emitting diode 70 according to the seventh embodiment of the present invention.

The light-emitting diode 70 is formed on a sapphire substrate 71, the main face of which is of a-face ((11–20) plane). The layer structure is composed, in sequence, of the sapphire substrate 71, a GaN buffer layer 72, a Zn doped GaN layer 73, an Si doped n-GaN layer 74, an n-InGaN light-emitting layer 75, an Mg doped p-AlGaN layer 76 and an Mg doped p-GaN layer 77.

The GaN buffer layer 72 has a thickness of 0.1 μm, and is present in order to relax lattice mismatching between the sapphire substrate and the GaN layer. The GaN layer 73 has a thickness of 0.3 μm, and Zn is added in order to promote two-dimensional growth, which is a characteristic point of this embodiment. A Zn concentration is proper to fall in a range of from $1 \times 10^{15}$ cm$^{-3}$ to $1 \times 10^{17}$ cm$^{-3}$, and preferably of $1 \times 10^{15}$ cm$^{-3}$ to $3 \times 10^{16}$ cm$^{-3}$. The Si doped n-GaN layer 74 has a thickness of 4 μm and is located to flow electrons into the light-emitting layer. Also, the layer 74 is formed somewhat thicker, so as to expose the n-layer by etching because a sapphire of insulating material is used as a substrate. A carrier concentration of the layer 74 is about $2 \times 10^{18}$ cm$^{-3}$.

The n-InGaN light-emitting layer 75 has a thickness of 0.3 μm. Also, Si and Zn are added in order to control a light-emitting wavelength to about 450 nm, when the In composition ratio is 6%. When the In composition ratio is raised up to about 30%, the light-emitting wavelength is adjustable by adding Si only.

The Mg doped p-AlGaN layer 76 has a thickness of 0.2 μm and serves to flow holes into the light-emitting layer. Also, while the Al composition ratio is preferred to be large enough to restrict overflow of electrons, it is also preferred to be smaller to ensure concentration of the p-type carrier. From these conditions, the Al composition ratio is preferred to fall in a range of from 5 to 25%, and more preferably to be from 10 to 20%.

The Mg doped p-GaN layer 77 has a thickness of 0.2 μm, and is formed since it is difficult to get a good ohmic contact by the AlGaN layer 76. A carrier concentration is preferred to be about $1 \times 10^{18}$ cm$^{-3}$ or more, and is set at $2 \times 10^{18}$ cm$^{-3}$ in this case. Further, within the p-layer 76 and 77 Si is added in a small amount of Si to improve etching.

As ohmic electrodes, a thin film layered structure 78, composed of Ni of 20 nm thickness and Au of 300 nm thickness, is formed on each of p- and n-layers, and, after heat-treatment for formation of good ohmic electrodes, a thin film layered structure 79, composed of Ti of 50 nm thickness and Au of 2 μm thickness, is formed for bonding. Such a light-emitting diode 70 showed a brightness of about 2 cd at 20 mA.

The present invention is not limited to the above embodiments, but variations thereof may be embodied without departing from the scope of the present invention. Although the light-emitting elements are described in the above embodiments, a thin film transistor, which uses the film mentioned above at the channel area, as well as a hetero junction type bipolar transistor, which uses the film for emitter, base and collector layers, may be used. Since the transistor is formed by the film having improved crystalline property, it is expected to provide a device capable of high-speed operation.

According to the present invention, by atoms, such as C or Si, being present within each nitride compound semiconductor layer, various problems concerning nitride compound semiconductor films, such as crystal growth, nitrogen vacancies, etching and impurity diffusion, are solved, and a fine and manageable crystal is obtained. Further, the light-emitting strength as well as the reliability of the light-emitting element is improved.

What is claimed is:

1. A compound semiconductor device comprising:
   a crystal substrate; and
   a first semiconductor film composed of an n-type nitride compound supported by said substrate and formed through vapor phase growth,
   wherein said first semiconductor film contains at least one of $1 \times 10^{15}$ cm$^{-3}$ to $1 \times 10^{17}$ cm$^{-3}$ of magnesium and $1 \times 10^{15}$ cm$^{-3}$–$1 \times 10^{17}$ cm$^{-3}$ of zinc so as to improve a shift from its three-dimensional growth to its two-dimensional growth.

2. The device according to claim 1, further comprising a second semiconductor film composed of at least one p- and i-type nitride compound, supported by said substrate and formed through vapor phase growth and containing magnesium, wherein said second semiconductor film contains $1 \times 10^{16}$ cm$^{-3}$ to $8 \times 10^{17}$ cm$^{-3}$ of silicon so as to facilitate etching thereof.

3. The device according to claim 1, further comprising a second semiconductor film composed of at least one of p- and i-type nitride compound, supported by said substrate and formed through vapor phase growth and containing magnesium, wherein said first and second semiconductor films are mutually laminated, and said first semiconductor film contains $3 \times 10^{18}$ cm$^{-3}$ to $1 \times 10^{20}$ cm$^{-3}$ of hydrogen so as to prevent magnesium from diffusing thereinto from said second semiconductor film.

4. The device according to claim 2, wherein said first and second semiconductor films are mutually laminated, and said first semiconductor film contains $3 \times 10^{18}$ cm$^{-3}$ to $1 \times 10^{20}$ cm$^{-3}$ of hydrogen so as to prevent magnesium from diffusing thereinto from said second semiconductor film.

5. The device according to claim 4, wherein said device includes a plurality of semiconductor films each composed of nitride compound and constituting a light-emitting diode supported by said substrate, and said first and second semiconductor films are two of said plurality of semiconductor films.

6. The device according to claim 5, wherein each of said plurality of semiconductor films contains at least one of $1 \times 10^{16}$ cm$^{-3}$ to $5 \times 10^{17}$ cm$^{-3}$ of carbon, $1 \times 10^{18}$ cm$^{-3}$ to $1 \times 10^{20}$ cm$^{-3}$ of oxygen, $1 \times 10^{16}$ cm$^{-3}$ to $1 \times 10^{18}$ cm$^{-3}$ of selenium, and $1 \times 10^{16}$ cm$^{-3}$ to $1 \times 10^{18}$ cm$^{-3}$ of sulfur so as to fill nitrogen vacancies thereof.

7. The device according to claim 6, wherein each of said plurality of semiconductor films is composed of a material selected from a group consisting of GaN, InGaN and InGaAlN.

8. A compound semiconductor device comprising:
   a crystal substrate; and
   a first semiconductor film composed of nitride compound, supported by said substrate and formed through vapor phase growth,
   wherein said first semiconductor film contains at least one of $1 \times 10^{16}$ cm$^{-3}$ to $5 \times 10^{17}$ cm$^{-3}$ of carbon, $1 \times 10^{18}$ cm$^{-3}$ to $1 \times 10^{20}$ cm$^{-3}$ of oxygen, $1 \times 10^{16}$ cm$^{-3}$ to $1 \times 10^{18}$ cm$^{-3}$ of selenium, and $1 \times 10^{16}$ cm$^{-3}$ to $1 \times 10^{18}$ cm-3 of sulfur so as to fill nitrogen vacancies thereof.

9. The device according to claim 8, wherein said device includes a plurality of semiconductor films each composed of nitride compound and constituting a light-emitting diode supported by said substrate, and said first semiconductor film is one of said plurality of semiconductor films.

10. The device according to claim 9, wherein each of said plurality of semiconductor films is composed of a material selected from a group consisting of GaN, InGaN and InGaAlN.

11. A compound semiconductor device comprising:

a crystal substrate; and a second semiconductor film composed of at least one of p- and i-type nitride compound supported by said substrate and formed through vapor phase growth and containing magnesium, wherein said second semiconductor film contains $1\times10^{16}$ cm$^{-3}$ to $8\times10^{17}$ cm$^{-3}$ of silicon so as to facilitate etching thereof.

12. The device according to claim 11, further comprising a first semiconductor film composed of at least one of n- and i-type nitride compound supported by said substrate and formed through vapor phase growth, wherein said first and second semiconductor films are mutually laminated, and said first semiconductor film contains $3\times10^{18}$ cm$^{-3}$ to $1\times10^{20}$ cm$^{-3}$ of hydrogen so as to prevent magnesium from diffusing thereinto from said second semiconductor film.

13. The device according to claim 12, wherein said device includes a plurality of semiconductor films each composed of nitride compound and constituting a light-emitting diode supported by said substrate, and said first and second semiconductor films are two of said plurality of semiconductor films.

14. The device according to claim 13, wherein each of said plurality of semiconductor films contains at least one of $1\times10^{16}$ cm$^{-3}$ to $5\times10^{17}$ cm$^{-3}$ of carbon, $1\times10^{18}$ cm$^{-3}$ to $1\times10^{20}$ cm$^{-3}$ of oxygen, $1\times10^{16}$ cm$^{-3}$ to $1\times10^{18}$ cm$^{-3}$ of selenium, and $1\times10^{16}$ cm$^{-3}$ to $1\times10^{18}$ cm$^{-3}$ of sulfur so as to fill nitrogen vacancies thereof.

15. The device according to claim 14, wherein each of said plurality of semiconductor films is composed of a material selected from a group consisting of GaN, InGaN and InGaAlN.

16. A compound semiconductor device comprising:

a crystal substrate; and first and second semiconductor films supported by said substrate and mutually laminated, said first semiconductor film being composed of at least one of n- and i-type nitride compound, formed through vapor phase growth, said second semiconductor film being composed of at least one of p- and i-type nitride compound containing magnesium, wherein said first semiconductor film contains $3\times10^{18}$ cm$^{-3}$ to $1\times10^{20}$ cm$^{-3}$ of hydrogen so as to prevent magnesium from diffusing thereinto from said second semiconductor film.

17. The device according to claim 16, wherein said second semiconductor film contains $1\times10^{16}$ cm$^{-3}$ to $8\times10^{17}$ cm$^{-3}$ of silicon so as to facilitate etching thereof.

18. The device according to claim 16, wherein said device includes a plurality of semiconductor films each composed of nitride compound and constituting a light-emitting diode supported by said substrate, and said first and second semiconductor films are two of said plurality of semiconductor films.

19. The device according to claim 18, wherein each of said plurality of semiconductor films contains at least one of $1\times10^{16}$ cm$^{-3}$ to $5\times10^{17}$ cm$^{-3}$ of carbon, $1\times10^{18}$ cm$^{-3}$ to $1\times10^{20}$ cm$^{-3}$ of oxygen, $1\times10^{16}$ cm$^{-3}$ to $1\times10^{18}$ cm$^{-3}$ of selenium, and $1\times10^{16}$ cm$^{-3}$ to $1\times10^{18}$ cm$^{-3}$ of sulfur so as to fill nitrogen vacancies thereof.

20. The device according to claim 19, wherein each of said plurality of semiconductor films is composed of a material selected from a group consisting of GaN, InGaN and InGaAlN.

* * * * *